United States Patent [19]

Sato et al.

[11] Patent Number: 4,901,137
[45] Date of Patent: Feb. 13, 1990

[54] ELECTRONIC APPARATUS HAVING SEMICONDUCTOR DEVICE

[75] Inventors: Hideki Sato; Nobuyuki Mizunoya, both of Yokohama, Japan

[73] Assignee: Kabushiki Kaisha Toshiba, Kanagawa, Japan

[21] Appl. No.: 225,130

[22] Filed: Jul. 28, 1988

[30] Foreign Application Priority Data

Jul. 30, 1987 [JP] Japan .................... 62-190801

[51] Int. Cl.$^4$ ............................ H01L 23/02
[52] U.S. Cl. .................... 357/81; 357/74; 357/72; 361/417; 228/123
[58] Field of Search ............ 357/81, 74, 72, 67; 361/417, 419; 228/123, 179, 180.1, 180.2

[56] References Cited

U.S. PATENT DOCUMENTS

| | | | |
|---|---|---|---|
| 4,540,673 | 9/1985 | Takeda et al. | 501/96 |
| 4,770,953 | 9/1988 | Horiguchi et al. | 361/386 |

FOREIGN PATENT DOCUMENTS

| | | |
|---|---|---|
| 0153618 | 9/1985 | European Pat. Off. . |
| 0153737 | 9/1985 | European Pat. Off. . |
| 0185244 | 6/1986 | European Pat. Off. . |
| 0217584 | 4/1987 | European Pat. Off. . |

OTHER PUBLICATIONS

Kurokawa et al., "Highly Thermal Conductive Aluminum Nitride Substrate", 298 NEC Research & Development, Apr. 1987, No. 85, pp. 15-21.

Primary Examiner—Andrew J. James
Assistant Examiner—Mark Prenty
Attorney, Agent, or Firm—Finnegan, Henderson, Farabow, Garrett and Dunner

[57] ABSTRACT

Disclosed is an electronic apparatus wherein a large power consumption type semiconductor device is mounted on a ceramic substrate of sintered aluminum nitride with high thermal conductivity for improving a heat dissipation effect. The electronic apparatus is, for example, an ignitor. The aluminum nitride-made ceramic substrate having the semiconductor device is provided in a metallic vessel made of aluminum or the like. Employed is a thermal stress strain-resistant adhesive agent with high thermal conductivity such as a silicone type adhesive agent for bonding. The thermal stress strain-resistant adhesive agent layer serves as a cushioning layer for a heating and cooling cycle and therefore improves a heat cycle resistance.

7 Claims, 2 Drawing Sheets

1

ELECTRONIC APPARATUS HAVING SEMICONDUCTOR DEVICE

The present application claims priority of Japanese Patent Application No. 62-190801 filed on July 30, 1987.

FIELD OF THE INVENTION AND RELATED ART STATEMENT

The present invention relates to an electronic apparatus on which is mounted a large power consumption type semiconductor device such as a power transistor, and more particularly to an electronic apparatus which is excellent in heat dissipation from the semiconductor device and a heat cycle resistance in a bonding portion between a ceramic substrate for mounting a semiconductor device and a metallic vessel, and has high reliability.

An ignition control unit mounted on vehicles such as a car, so called "an ignitor", serves to allow current to flow intermittently through an ignition coil by using a semiconductor device such as a power transistor so as to control ignition time of a spark plug.

Such an ignitor comprises an insulated substrate including an ignition time control member such as a power transistor mounted thereon, a die casting vessel made of aluminum and holding the insulated substrate and a driving circuit in the vessel as well.

FIG. 2 shows one example of a conventional ignitor construction.

A ceramic substrate 4 made of alumina includes metallized layers 2 and 3 formed on both surfaces thereof. An ignition time control member 1 is bonded on the metallized layer 2 by soldering or brazing portion 6 through a heat sink 5 of such as molybdenum. Further, the metallized layer 3 formed on the ceramic substrate 4 is bonded with a metallic vessel 7 for holding the ceramic substrate 4 having the ignition time control member 1 thereon by soldering portion 8.

The ignitor using the ceramic substrate made of alumina requires the heat sink made of molybdenum or the like as described above. However, it causes an increase of manufacturing cost because the alumina has small thermal conductivity and insufficient heat dissipation.

Therefore, a ceramic substrate made of beryllia has been used in lieu of the substrate made of alumina, since beryllia is excellent in heat dissipation. However, beryllia requires an attention in handling because of its toxicity, and it is expensive.

Recently, a ceramic substrate made of aluminum nitride has been considered to be used for an ignitor substrate since aluminum nitride has high thermal conductivity and no toxicity.

The ceramic substrate made of aluminum nitride has higher thermal conductivity as compared with the ceramic substrate made of alumina. The substrate made of aluminum nitride suits for mounting a semiconductor device such as a power transistor with large heat dissipation. Furthermore, as is obvious from the graph of FIG. 3 which shows a thermal expansion coefficient against the temperature of each material, the aluminum nitride has a thermal expansion coefficient approximating to silicon to be used for a semiconductor device material. Therefore, it has an advantage that defects such as cracks are hardly caused on a solder layer on the metallized layer on which the ignition time control member is mounted, even in case of a recurrent heating and cooling cycle.

When the ceramic substrate made of aluminum nitride is used for an ignitor, it is necessary to consider the bonding with the metallic vessel. Generally, the vessel made of aluminum has been used in view of the heat dissipation and manufacturing cost. As is obvious from the graph of FIG. 3, there is a greater difference between the thermal expansion coefficient of aluminum and that of aluminum nitride than the difference between alumina and aluminum nitride. The difference may cause the problem that there exists a possibility of causing a strain on a solder layer due to thermal stress resulting from the difference of a thermal expansion coefficient between both materials when the aluminum nitride-made ceramic substrate mounting member is bonded on the aluminum-made vessel using solder and, beside, subject to the recurrent heating and cooling cycle. The defect such as a strain brings about adverse effects of lowering thermal conductivity and thus semiconductor device function, resulting in breaking a semiconductor device.

As described above, the ignitor in which a ceramic substrate made of aluminum nitride is used, is not sufficient, has not a heat cycle resistance and is lacking in reliability as a whole device.

Generally, an electronic apparatus having the structure wherein a large power consumption type semiconductor device with the large heat dissipation is mounted on a ceramic substrate made of aluminum nitride and is held in a metallic vessel, has the same problem as described above.

OBJECT AND SUMMARY OF THE INVENTION

It is an object of the present invention to provide an electronic apparatus having a large power consumption type semiconductor device such as an ignitor, which device alleviates thermal stress strain resulting from the difference of thermal expansion coefficient between a ceramic substrate made of aluminum nitride and a vessel made of aluminum for improving a heat cycle resistance.

It is another object of the present invention to provide an electronic apparatus in which a large power consumption type semiconductor device such as an ignitor is used for improving a heat dissipation characteristic by using a ceramic substrate made of aluminum nitride and for lowering the manufacturing cost by reducing parts to be mounted.

The electronic apparatus of this invention comprises a ceramic substrate made of sintered aluminum nitride, a metallized layer formed on a desired place of the ceramic substrate, a semiconductor device mounted on the metallized layer and a metallic vessel for holding the ceramic substrate with the semiconductor device mounted thereon, being bonded on the opposite surface to the semiconductor device-mounted surface of the ceramic substrate by means of a thermal stress strain-resistant adhesive agent and being resin-sealed in the vessel.

The sintered aluminum nitride used in this invention has a powder mixture containing an aluminum nitride powder and a sintering aid as a starting material, which sintering aid contains a compound of rare earth elements such as yttrium oxide, a compound of alkaline earth elements such as calcium oxide or alumina. Moreover, the compounds of rare earth elements and alkaline earth elements may be silicide, carbide, nitride, fluoride or a compound of them without limiting to oxide. In addition, the amount of the sintering aid to be added is preferably in the range of 0.1 to 20% by weight, and more preferably in the range of 0.5 to 10% by weight.

The ceramic substrate of sintered aluminum nitride used in this invention, can be produced in such a manner that the above-mentioned starting material containing organic binder added thereto is molded into a given form in accordance with a given method and then sintered under normal pressure or atmosphere pressure. Alternatively, a sintering method such as a hot press method may be employed.

In addition, it is preferable to use the ceramic substrate made of aluminum nitride having thermal conductivity of not less than 50 W/m.K in view of heat dissipation.

The metallized layer is formed on the ceramic substrate by the methods described below.

(1) Direct bonding method wherein a metallic plate such as a copper plate is directly disposed and bonded on the ceramic substrate by heating.

(2) Metallizing method using a metallizing composite mainly consisting of a high melt point metal such as molybdenum, tungsten or tantalum and a compound such as an oxide or a nitride of the III and IVa group elements in the periodic table, such as titanium, zirconium or aluminum.

In particular, the metallized layer formed by the metallizing method as described in (2) is proper for the present invention, because the layer is more strongly bonded on the ceramic substrate of aluminum nitride and therefore has superior reliability as to soldering or brazing.

In addition, a metal-plated layer of nickel or gold is formed on the metallized layer before an ignition time control member is mounted.

The thermal stress strain-resistant adhesive agent for bonding the ceramic substrate on the metallic vessel, which is a characterizing factor of the present invention, is to be selected in view of wetting and thermal conductivity against the ceramic substrate of aluminum nitride and a metallic vessel. The heat resisting temperature of the adhesive agent should be normally about 150° C. which causes no breakage or softening at the time of heat dissipation from a semiconductor device.

The ignitor, which is one example of the electronic apparatus of the present invention, generally uses a die casting aluminum-made vessel in view of heat dissipation and manufacturing cost. As the thermal stress strain-resistant adhesive agent, it is desired to use a silicone type agent since it is superior in wetting and thermal conductivity against aluminum nitride and aluminum. The silicone type adhesive agent normally has about 180° C. of heat resisting temperature and thermal conductivity in the range of 5 to 15 W/m. K.

As the silicone type adhesive agent, a silicone resin agent, RTV type (ordinary temperature vulcanization type) silicone rubber type agent and HTV type (heating vulcanization type) silicone rubber agent, etc., can be exampled.

In addition to these adhesive agents, the other organic adhesive agents such as a polyamideimide type agent or a polyimide type agent may be used.

As described above, since the adhesive agent is used for bonding a ceramic substrate of aluminum nitride on the metallic vessel, the adhesive agent serves as a cushioning layer and dramatically alleviates thermal stress strain resulting from the difference of thermal expansion coefficient in the heat cycle process. As a result, the present invention is superior in a heat cycle resistance.

DETAILED DESCRIPTION OF PREFERRED EMBODIMENTS

Now, the preferred embodiment of this invention will be described with reference to the drawings.

Figure 1:
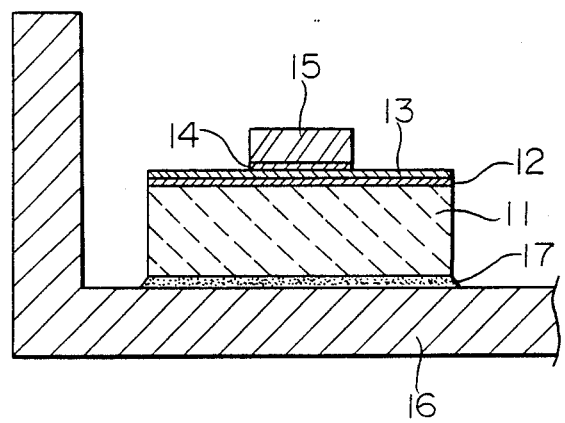
FIG. 1 is a sectional view showing an essential portion of an ignitor of one example of the electronic apparatus of this invention.
Figure 2:
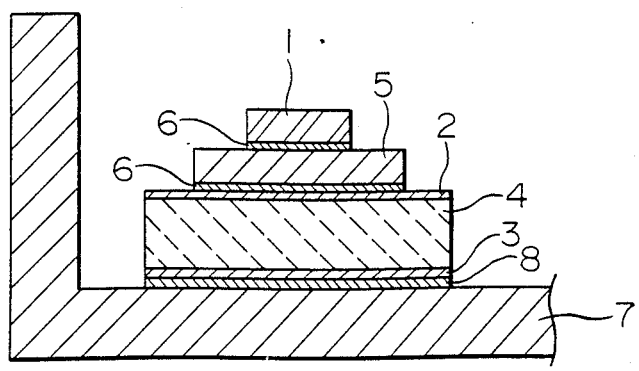
FIG. 2 is a sectional view showing an essential portion of one example of the conventional ignitor.
Figure 3:
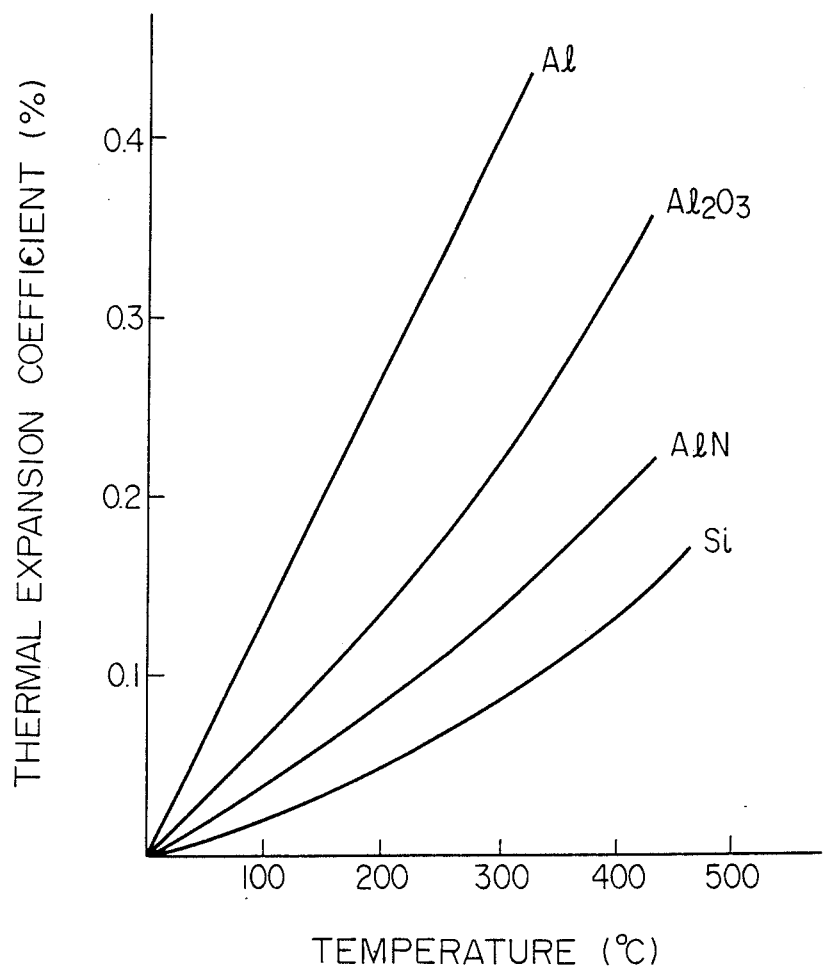
FIG. 3 is a graph showing the relation between temperatures and thermal expansion coefficient of the several kinds of materials.

FIG. 1 is a sectional view showing an essential portion of an ignitor of one example of the electronic apparatus of this invention.

In FIG. 1, reference numeral 11 denotes a ceramic substrate of sintered aluminum nitride. On the desired place of the ceramic substrate 11, a metallized layer 12 and a metal-plated layer 13 are formed in order.

On the metal-plated layer 13, a semiconductor device, such as, an ignition time control member 15 is mounted and bonded by means of a solder layer 14.

The ceramic substrate 11 having the ignition time control member 15 thereon is held in a die casting vessel 16 made of aluminum. The vessel 16 is bonded on the opposite surface of the surface of the ceramic substrate 11 on which the device is mounted by means of a silicone resin type refractory adhesive agent 17. Moreover, in this die casting aluminum-made vessel 16, a driving circuit (not shown) is also held and sealed by means of resin (not shown).

Now, a description will be directed to an example for manufacturing the ignitor having the above-described construction and the estimated results of its characteristic.

Aluminum nitride powder was mixed with 4% by weight of yttrium oxide as a sintering aid to produce a starting material. Then, as an organic binder, paraffin was added to and mixed with the starting material, and a substrate shape of molded article was produced by a doctor blade method. Then, the obtained molded article was calcined under the nitrogen atmosphere at a temperature of 1,850° C. for three hours to obtain a ceramic substrate 11 of aluminum nitride having thermal conductivity of 70 W/m.K.

Further, the powder mixture of molybdenum and titanium mixed at the ratio of 1:1 (weight ratio), was mixed with a certain amount of ethyl cellulose to obtain a paste. The paste was coated on the surface of the ceramic substrate 11 on which the device is mounted, so as to form a desired pattern by a screen print method. Then, the metallized layer 12 was heated and calcined under nitrogen atmosphere at a temperature of 1700° C. for one hour. On this metallized layer, a gold-plated layer 13 was formed by means of an electroless plating method. Then, on the metallized layer 13, an ignition time control member 15 was bonded on the metallized layer 13 by soldering.

Further, the ceramic substrate 11 having the ignition timed control member 15 thereon was held in a die casting aluminum-made vessel 16. And, the silicone resin type adhesive agent TSE-3380 (product of Toshiba Silicone Co., Ltd.) was provided between the opposite surface to surface of the ceramic substrate 11 on which the device is mounted and the die casting aluminum-made vessel 16 so as to bond each to the other after leaving it for two hours at a room temperature. The driving circuit was also provided in the die casting aluminum-made vessel 16.

Then, the die casting aluminum-made vessel was resin-sealed to obtain an ignitor.

The heat cycle test was carried out with regard to the ignitor produced as described above, and the reference ignitor produced in the same manner as the embodiment except the use of soldering in lieu of the thermal stress strain-resistant adhesive agent. It was performed for each ten ignitors at one cycle of the temperatures in the range of $-65°$ C. to $150°$ C. and $150°$ C. to $-65°$ C.

The result was that the ignitors of the embodiment had a crack occurrence factor of 0% even after 1000 cycles test, while 4% of the reference ignitors had cracks occurring on the solder layer on the side of the die casting aluminum-made vessel after 100 cycles test. Furthermore, the presence of cracks was determined using an optical microscope, the fluoroscopic flaw detection method and the withstand voltage test.

Furthermore, in the manufacturing process of the ignitor, estimated was the bonding strength between the metallized layer and the ceramic substrate made of aluminum nitride. The estimating method was such that a Koval-made wire was soldered on the gold-plated layer formed on the metallized layer. This wire was pulled in the vertical direction of the metallized layer, and the strength was estimated when the metallized layer was striped from the metallized layer. The result was 2 $Kg/mm^2$ or more.

As described above, since the electronic apparatus, an ignitor, of the present invention uses a thermal stress strain-resistant adhesive agent which alleviates thermal stress strain resulting from the difference of thermal expansion coefficient between the ceramic substrate made of aluminum nitride and the metallic vessels for holding, it is excellent in a heat cycle resistance. Consequently, the present invention provides a very reliable electronic apparatus which makes sufficient use of large thermal conductivity of the ceramic substrate made of aluminum nitride and is superior in heat dissipation.

Furthermore, since the ceramic substrate made of aluminum nitride is far superior to the conventional ceramic substrate made of alumina in the heat dissipation, the heat sink is unnecessary. Moreover, the metallized layer is required to form only on one surface of the ceramic board, so that the manufacturing cost is lowered accordingly.

In addition, the above embodiment has described the ignitor, while the invention is also effective for various electronic apparatus uses a large consumption type semiconductor device and has the structure wherein the device is held in the metallic vessel.

What is claimed is:

1. An electronic apparatus, comprising
   a ceramic substrate of sintered aluminum nitride;
   a metallized layer formed on a first surface of said ceramic substrate;
   a semiconductor device mounted on said metallized layer;
   a metallic vessel for holding said ceramic substrate with said semiconductor device, bonded on an opposite surface of the first surface of said ceramic substrate by means of a thermal stress and strain-resistant adhesive agent; and
   wherein an internal portion of said metallic vessel is resin-sealed.

2. The electronic apparatus of claim 1, wherein said thermal stress and strain-resistant adhesive agent is a silicone type adhesive agent.

3. The electronic apparatus of claim 2, wherein said metallic vessel is an aluminum vessel.

4. The electronic apparatus of claim 1, wherein said ceramic substrate of sintered aluminum nitride comprises not more than 20% by weight of sintering aid.

5. The electronic apparatus of claim 4, wherein said sintering aid is at least one material selected from the group consisting of rare earth elements, a compound of alkaline earth elements and an aluminum oxide.

6. The electronic apparatus of claim 1, wherein said metallized layer comprises at least one element selected from the group consisting of molybdenum, tungsten and tantalum and at least one element selected from the III group and the IVa group in the periodic table.

7. The electronic apparatus any one of claims 1 through 6, wherein said electronic apparatus is an ignitor having an ignition time control member.

* * * * *